United States Patent
Yamauchi et al.

(10) Patent No.: US 10,581,422 B2
(45) Date of Patent: Mar. 3, 2020

(54) PWM MODULATOR

(71) Applicant: Kabushiki Kaisha Toshiba, Minato-ku, Tokyo (JP)

(72) Inventors: Akira Yamauchi, Yokohama Kanagawa (JP); Toshikazu Fujii, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 165 days.

(21) Appl. No.: 15/443,471

(22) Filed: Feb. 27, 2017

(65) Prior Publication Data
US 2018/0076806 A1 Mar. 15, 2018

Related U.S. Application Data

(60) Provisional application No. 62/385,422, filed on Sep. 9, 2016.

(51) Int. Cl.
| | | |
|---|---|---|
| H03K 7/08 | (2006.01) |
| H03F 3/183 | (2006.01) |
| H03F 3/217 | (2006.01) |
| H03F 1/04 | (2006.01) |
| H04B 1/56 | (2006.01) |

(52) U.S. Cl.
CPC .......... *H03K 7/08* (2013.01); *H03F 1/04* (2013.01); *H03F 3/183* (2013.01); *H03F 3/2171* (2013.01); *H04B 1/56* (2013.01); *H03F 2200/03* (2013.01); *H03F 2200/171* (2013.01); *H03F 2200/351* (2013.01)

(58) Field of Classification Search
CPC .......... H04B 1/525; H04B 1/56; H04B 15/00; H03F 1/26; H03F 1/30; H03F 1/04; H03F 1/34; H03F 3/217

USPC ...... 330/251, 10, 207 A, 149; 332/109, 162, 332/159, 160, 161; 381/13, 106, 116, 381/117, 94.1
See application file for complete search history.

(56) References Cited

U.S. PATENT DOCUMENTS

| | | | |
|---|---|---|---|
| 4,319,204 A * | 3/1982 | Weldon ................ | H03C 1/50 332/113 |
| 5,994,973 A | 11/1999 | Toki | |

FOREIGN PATENT DOCUMENTS

| | | |
|---|---|---|
| JP | 2005-109590 A | 4/2005 |
| JP | 2012-160967 A | 8/2012 |

OTHER PUBLICATIONS

Product Data Sheet of TDF8599B, NXP Semiconductor, Aug. 23, 2016.

* cited by examiner

*Primary Examiner* — Arnold M Kinkead
(74) *Attorney, Agent, or Firm* — White & Case LLP

(57) ABSTRACT

A PWM modulator according to an embodiment includes a first comparator configured to compare a first input signal with a first carrier and output a comparison result, a second comparator configured to compare a second input signal with a second carrier and output a comparison result, and a selector configured to output the comparison result while switching between the comparison result of the first comparator and the comparison result of the second comparator in a cycle according to a cycle of the first or the second carrier.

10 Claims, 14 Drawing Sheets

FIG. 5A SOUND SIGNAL / INVERTED SOUND SIGNAL / CARRIER
FIG. 5B AD−A, BD−A ΔAD
FIG. 5C BD−B
FIG. 5D ΔBD
FIG. 5E SOUND SIGNAL / INVERTED SOUND SIGNAL / CARRIER
FIG. 5F AD−A, BD−A ΔAD
FIG. 5G BD−B
FIG. 5H ΔBD
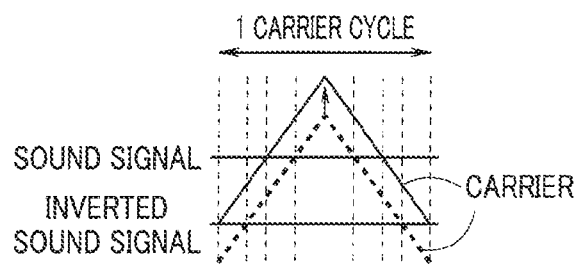
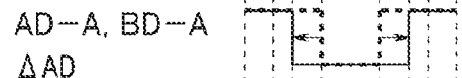
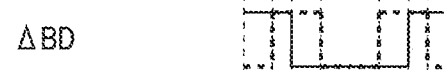
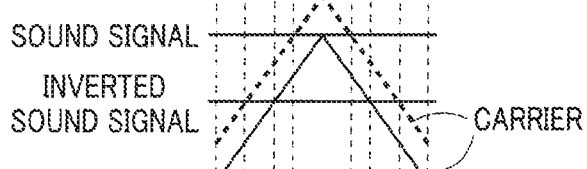
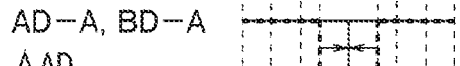
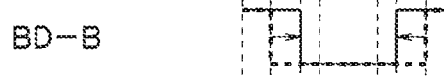

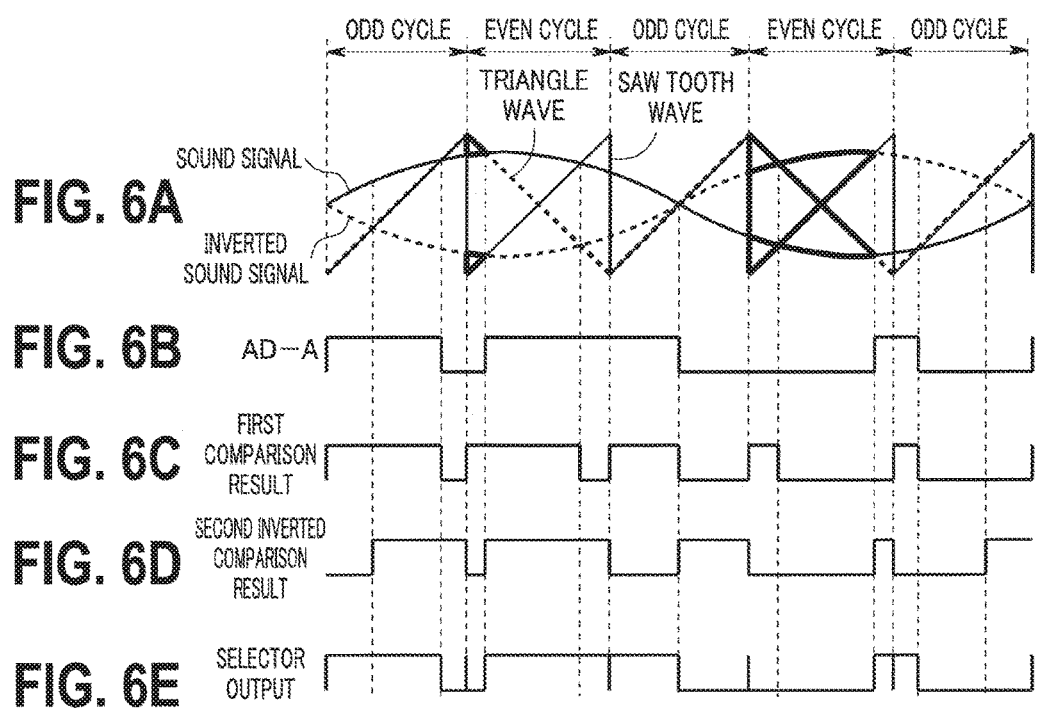

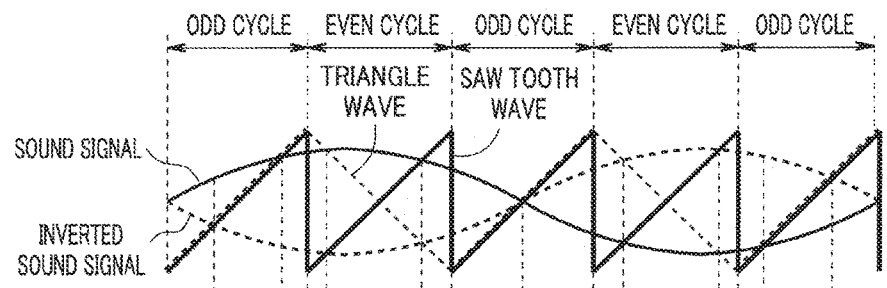
FIG. 7A
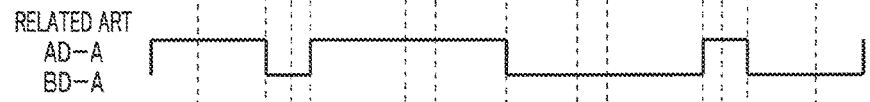
FIG. 7B RELATED ART AD-A BD-A
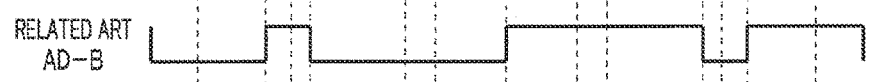
FIG. 7C RELATED ART AD-B
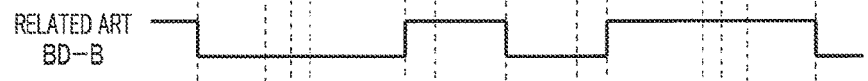
FIG. 7D RELATED ART BD-B
FIG. 7E FIRST COMPARISON RESULT
FIG. 7F FIRST INVERTED COMPARISON RESULT
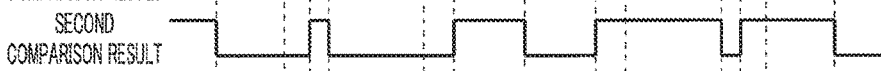
FIG. 7G SECOND COMPARISON RESULT
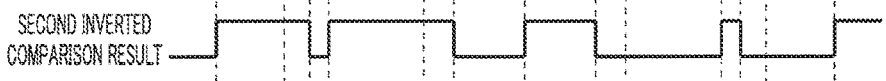
FIG. 7H SECOND INVERTED COMPARISON RESULT
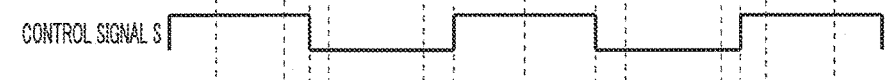
FIG. 7I CONTROL SIGNAL S
FIG. 7J AD-A BD-A
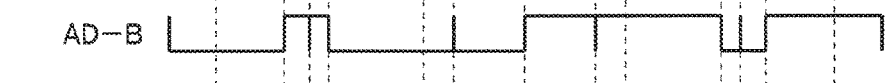
FIG. 7K AD-B
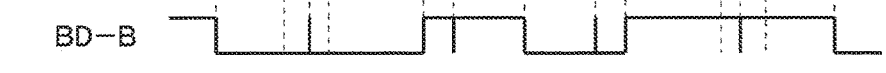
FIG. 7L BD-B

FIG. 8A  SOUND SIGNAL / INVERTED SOUND SIGNAL / CARRIER / ODD CYCLE / EVEN CYCLE

FIG. 8E  SOUND SIGNAL / INVERTED SOUND SIGNAL / CARRIER

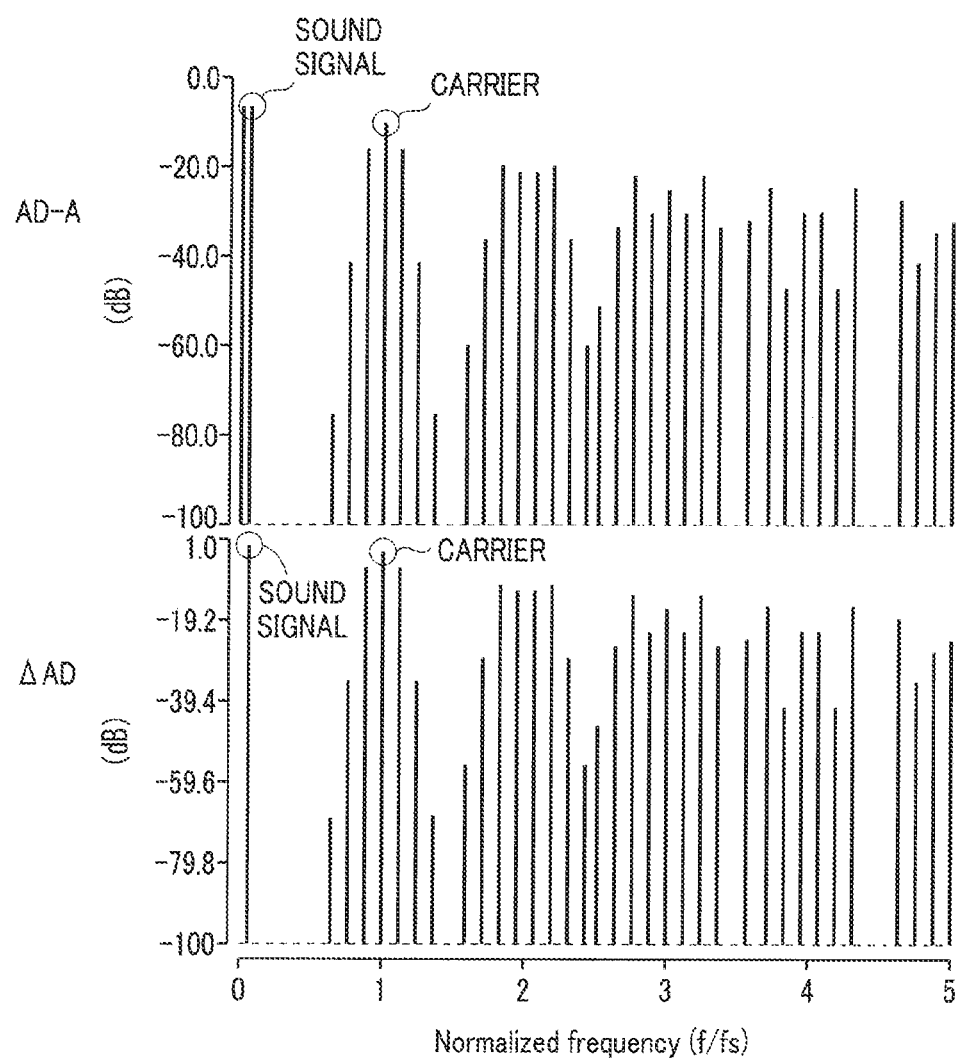

PWM MODULATOR

CROSS-REFERENCE TO RELATED APPLICATIONS

This application is based upon and claims the benefit of priority from U.S. Provisional Application No. 62/385,422, filed on Sep. 9, 2016, the entire contents of which are incorporated herein by reference.

FIELD

Embodiments described herein relate generally to a PWM modulator.

BACKGROUND

In recent years, as an audio amplifier such as an in-car audio amplifier, a class D amplifier which employs a PWM modulator has been in widespread use. The PWM modulator, which is used as a switching converter, generates a PWM signal of a pulse width according to an amplitude of a sound signal in the class D amplifier.

The PWM modulator modulates the pulse width of the sound signal by comparing the sound signal with a carrier of a saw tooth wave (one side edge) or a triangle wave (both side edges). The PWM modulator is used in Class-AD in which a binary switching waveform is obtained as a result of modulation of the pulse width or in Class-BD in which a three-valued switching waveform is obtained.

By the way, the Class-AD and the Class-BD respectively have advantages and disadvantages in characteristics, and, for example, the Class-AD has an advantage that common-mode noise is less likely to occur. Therefore, for example, in the in-car class D amplifier, the PWM modulator is preferably used in the Class-AD.

However, in the Class-AD, there is a problem that a non-ideal factor of a carrier generator generates a harmful effect on quality of the sound signal and complication of a demodulation filter. Therefore, conventionally, in order to obtain PWM modulation output with a high S/N ratio, a carrier generator with high performance and an expensive demodulation filter are required.

BRIEF DESCRIPTION OF THE DRAWINGS

FIG. 5A to FIG. 5H are waveform diagrams for explaining harmful effects generated by a non-ideal factor of a carrier generator;

FIG. 6A to FIG. 6E are waveform diagrams for explaining that a ΔAD signal of Class-AD can be obtained from a first comparison result and a second inverted comparison result;

FIG. 7A to FIG. 7L are waveform diagrams for explaining operation of the embodiment;

FIG. 8A to FIG. 8H are waveform diagrams for explaining effects of the embodiment;

FIG. 11A and FIG. 11B are graphs illustrating frequency response in the case where an ideal saw tooth wave carrier is generated in the present embodiment;

DETAILED DESCRIPTION

A PWM modulator according to an embodiment includes a first comparator configured to compare a first input signal with a first carrier and output a comparison result, a second comparator configured to compare a second input signal with a second carrier and output a comparison result and a selector configured to output the comparison result while switching between the comparison result of the first comparator and the comparison result of the second comparator in a cycle according to a cycle of the first or the second carrier.

The embodiment will be described in detail below with reference to the drawings.

Figure 1:
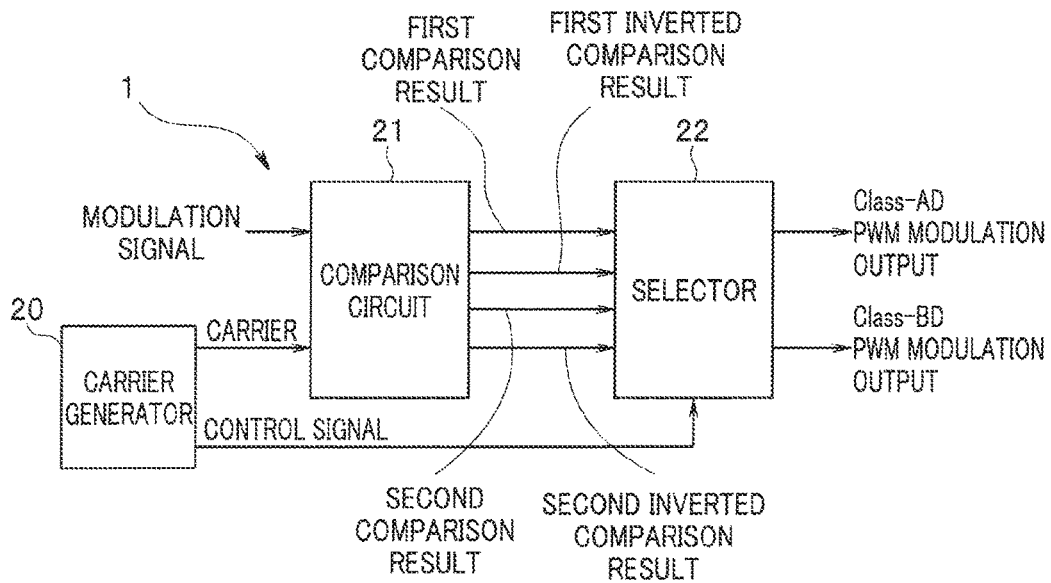
FIG. 1 is a block diagram illustrating a PWM modulator according to an embodiment.
Figure 2:
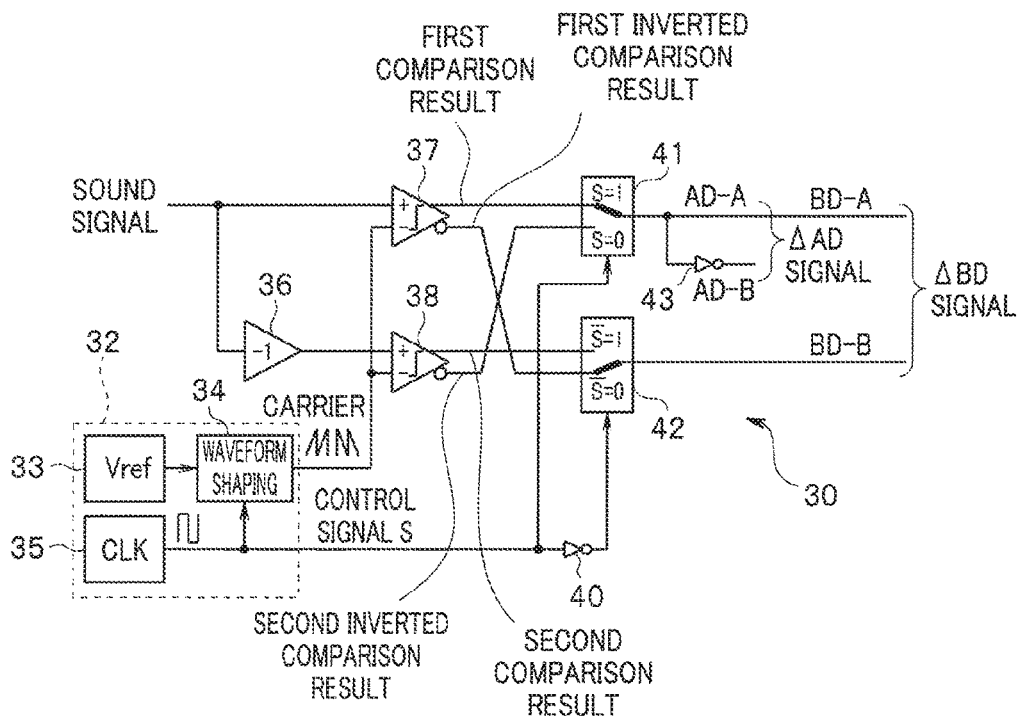
FIG. 2 is a circuit diagram illustrating an example of a specific circuit of the PWM modulator in FIG. 1.

FIG. 1 is a block diagram illustrating a PWM modulator 1 according to one embodiment of the present invention. Further, FIG. 2 is a circuit diagram illustrating a specific example of the PWM modulator in FIG. 1. Note that, while, in the embodiment, a sound signal will be described as an example of a modulation signal, the modulation signal is not limited to the sound signal and may be various kinds of signals.

In Class-AD in the PWM modulator, an Aside signal (hereinafter, referred to as an AD-A signal) which is a positive PWM modulation waveform, and a Bside signal (hereinafter, referred to as an AD-B signal) which is an inversion signal of the AD-A signal are generated through comparison between a sound signal and a carrier. Also in Class-BD, an Aside signal (hereinafter, referred to as a BD-A signal) which is a positive PWM modulation waveform having the same waveform as the waveform of the AD-A signal is generated through comparison between a sound signal and a carrier. Further, in the Class-BD, a Bside signal (hereinafter, referred to as a BD-B signal) which is a positive PWM modulation waveform is generated through comparison between an inversion signal of the sound signal and the carrier.

In the Class-AD, a ΔAD signal which is differential output which is a difference between the AD-A signal and the AD-B signal is utilized as output. Further, in the Class-BD, a ΔBD signal which is differential output which is a difference between the BD-A signal and the BD-B signal is utilized as output.

Figure 3:
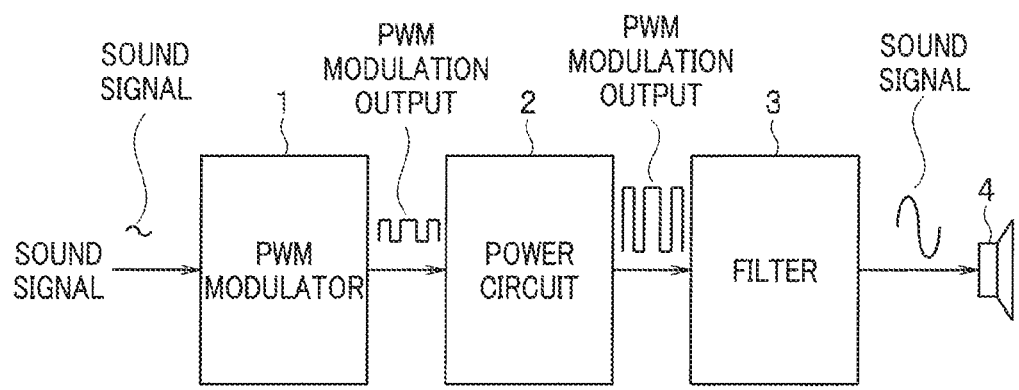
FIG. 3 is a block diagram illustrating a configuration of a class D amplifier which utilizes the PWM modulator in FIG. 1 along with a waveform of each unit.

Such a PWM modulator is used in, for example, a class D amplifier. FIG. 3 is a block diagram illustrating a configuration of the class D amplifier which utilizes the PWM modulator in FIG. 1 along with a waveform of each unit. In the class D amplifier in FIG. 3, the sound signal is input to the PWM modulator 1. The PWM modulator 1 generates PWM modulation output of a pulse width according to the sound signal as a modulated signal by modulating the sound signal to a carrier. The PWM modulation output is supplied to a power circuit 2, amplified, and then provided to a filter 3. The PWM modulation output includes a carrier component as well as a sound signal component, and the filter 3 restores the sound signal by removing the carrier component from the PWM modulation output. A speaker 4 outputs sound based on the sound signal from the filter 3.

Note that the filter 3 extracts an original sound signal component by removing the carrier component from the ΔAD or ΔBD signal amplified by the power circuit 2. In the case where PWM modulation is performed using an ideal carrier with no distortion, both the ΔAD signal and the ΔBD signal include sound signal components with no distortion, so that it is possible to restore the sound signal with no distortion from the filter 3 even in the case where either PWM modulation output is employed.

(Problems in the related art)

Figure 4:
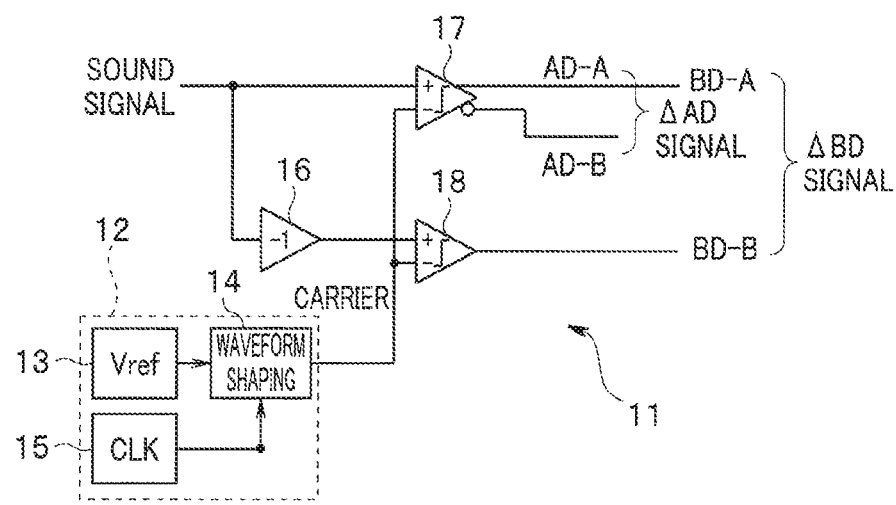
FIG. 4 is a circuit diagram illustrating the related art of the PWM modulator.

FIG. 4 illustrates a PWM modulator 11 of the related art. The PWM modulator 11 is configured with a carrier generator 12, an inverting circuit 16 and two comparators 17 and 18. In the carrier generator 12, a waveform shaping circuit 14 generates a carrier of a clock cycle by shaping a waveform of a reference voltage Vref of a reference voltage supply 13 in a clock cycle from a clock generator 15. Note that the carrier is, for example, a saw tooth wave having an upward inclined edge or a triangle wave having upward and downward inclined edges.

The comparator 17 compares the sound signal input to a non-inverted (normal phase) input end with a carrier input to an inverted (reverse phase) input end and outputs a positive Aside signal (AD-A signal) and a Bside signal (AD-B signal) which is an inversion signal of the Aside signal. The inverting circuit 16 inverts the sound signal and provides the inverted sound signal to a non-inverted input end of the comparator 18. The comparator 18 compares the inverted sound signal input to the non-inverted (normal phase) input end with a carrier input to an inverted (reverse phase) input end and outputs a Bside signal (BD-B signal).

The PWM modulation output from the comparator 17 is the AD-A signal and the AD-B signal in the Class-AD. Further, the Aside signal of the comparator 17 is also used as the BD-A signal which is the PWM modulation output of the Class-BD. The Bside signal which is the PWM modulation output from the comparator 18 is the BD-B signal in the Class-BD. As described above, the PWM modulation output of the difference between the AD-A signal and the AD-B signal is a ΔAD signal, and the PWM modulation output of the difference between the BD-A signal (=the AD-A signal) and the BD-B signal is a ΔBD signal.

Advantages of Class-BD

By the way, the ΔAD signal includes a carrier component and an odd harmonic component of the carrier component in addition to a sound signal component. On the other hand, while the ΔBD signal includes a sound signal component and a carrier component, the ΔBD signal does not include a harmonic component of the carrier component.

Further, also in the case where the carrier frequency is the same, the ΔBD signal has an effective sampling frequency which is double the sampling frequency of the ΔAD signal. Therefore, there are advantages of simplification of a filter for removing a carrier component, reduction of switching loss by decreasing the carrier frequency by half, or the like, in the case where the Class-BD is employed compared to the case where the Class-AD is employed.

Advantages of Class-AD

On the other hand, a system employing the PWM modulator is affected by not only the ΔAD signal and the ΔBD signal which are differential output, but also in-phase output. In the Class-AD, ΔAD in-phase output which is an in-phase component of the AD-A signal and the AD-B signal is generated. In the Class-BD, ΔBD in-phase output which is an in-phase component of the BD-A signal and the BD-B signal is generated. The AD-B signal is an inversion signal of the AD-A signal, and a level of the AD signal is constant and 0. On the other hand, the BD-B signal is obtained by comparing a signal obtained by inverting the sound signal with the carrier, and is equivalent to a signal obtained by shifting the phase of the BD-A signal by 180 degrees. Therefore, the level of the BD signal which is the in-phase output in the Class-BD does not become 0 and fluctuates. Accordingly, in the Class-BD, unnecessary radiation by the in-phase output from the PWM modulator is generated, and generates a harmful effect on other circuits. In the case where such common-mode noise is taken into account, particularly, in in-car application, or the like, it is preferable to employ the Class-AD.

Note that Literature 1 (TAS5414 datasheet, TEXAS INSTRUMENTS) discloses a PWM modulator configured to be able to switch between the Class-AD and the Class-BD. However, even if a system in which common-mode noise is reduced by employing the Class-AD is constructed in in-car application, or the like, there is a possibility that the following defects of the Class-AD may occur.

Disadvantages of Class-AD

The above-described advantages and disadvantages assume that an ideal carrier is output from the carrier generator. Actually, a non-ideal factor such as noise and distortion is added to the carrier. In the case where noise is mixed or distortion occurs in the carrier, in the Class-AD, there is a problem that waveform distortion occurs in the ΔAD signal, S/N degrades, and offset also occurs.

FIG. 5A to FIG. 5H are waveform diagrams for explaining harmful effects generated by the non-ideal factor of the carrier generator. FIG. 5A to FIG. 5H illustrate a state of one cycle of a carrier in the case where the carrier is a triangle wave. Dashed lines in FIG. 5A to FIG. 5H indicate an example in the case where an ideal carrier is generated, and solid lines indicate an example in the case where the carrier includes a non-ideal factor. FIG. 5A and FIG. 5E illustrate a carrier, a sound signal and an inverted sound signal, FIG. 5B and FIG. 5F illustrate an AD-A signal, a BD-A signal or a ΔAD signal, FIG. 5C and FIG. 5G illustrate a BD-B signal, and FIG. 5D and FIG. 5H illustrate a ΔBD signal.

Examples of the non-ideal factor of the carrier can include carrier noise and carrier distortion. The reference voltage supply 13 and the waveform shaping circuit 14 in FIG. 4 generate low-frequency noise caused by thermal noise and flicker noise of components. Such low-frequency carrier noise appears as DC fluctuation of the carrier in one cycle of the carrier.

Further, ideally, the carrier has linearity which linearly changes with respect to time. However, there is a case where the carrier has a non-ideal waveform having non-linearity with respect to time. Such non-linear carrier distortion also appears as DC fluctuation of the carrier in one cycle of the carrier.

FIG. 5A to FIG. 5D illustrate an example in the case where the DC fluctuation of the carrier appears at a positive side, and FIG. 5E to FIG. 5H illustrate an example in the case where the DC fluctuation of the carrier appears at a negative side. FIG. 5A illustrates that the DC of the carrier indicated with the dashed line fluctuates at the positive side by the non-ideal factor and changes to the carrier indicated with the solid line waveform. Further, FIG. 5E illustrates that the DC of the carrier indicated with the dashed line fluctuates to the negative side by the non-ideal factor and changes to the carrier indicated with the solid line waveform.

FIG. 5A and FIG. 5E illustrate that the carrier frequency is sufficiently higher than the sound signal frequency, and the level of the sound signal is substantially constant in one cycle of the carrier. FIG. 5A and FIG. 5E illustrate an example where the sound signal amplitude and the carrier amplitude are the same, and the inverted sound signal is a signal obtained by inverting the sound signal assuming that the center of the amplitude of the carrier (dashed line) is 0 level.

The AD-A signal and the BD-A signal are low levels (hereinafter, referred to as L levels) in the case where the sound signal level is smaller than the carrier signal level, and high levels (hereinafter, referred to as H levels) in other periods, and indicated with the dashed lines in FIG. 5B and FIG. 5F in the case where an ideal carrier is generated. Further, the AD-B signal is an inversion signal of the AD-A signal, and the ΔAD signal which is difference output is a signal, an H level and L level of which change in a similar manner to the H levels and the L levels of the AD-A signal and the BD-A signal.

The BD-B signal is an L level in the case where the inverted sound signal level is smaller than the carrier signal level, and an H level in other periods, and indicated with the dashed lines in FIG. 5C and FIG. 5G in the case where an ideal carrier is generated. The ΔBD signal is a difference between the BD-A signal and the BD-B signal illustrated in FIG. 5B and FIG. 5F, and, as is clear from comparison between FIG. 5B and FIG. 5C and comparison between FIG. 5F and FIG. 5G, the ΔBD signal in the case where the carrier is ideal, the ΔBD signal has the waveform indicated with the dashed line in FIG. 5D or FIG. 5H.

In the case where the DC of the carrier fluctuates, the AD-A signal, the BD-A signal and the ΔAD signal have a waveform indicated with the solid line in FIG. 5B or FIG. 5F, the BD-B signal has a waveform indicated with the solid line in FIG. 5C or FIG. 5G, and the ΔBD signal has a waveform indicated with the solid line in FIG. 5D or FIG. 5H.

While the waveform of the ΔBD signal illustrated in FIG. 5D or FIG. 5H changes between the dashed line and the solid line, a ratio between an H level period and an L level period, that is, a duty ratio is the same. On the other hand, concerning the ΔAD signal illustrated in FIG. 5B or FIG. 5F, the duty ratio changes between the dashed line waveform and the solid line waveform. That is, when the DC of the carrier fluctuates, the duty ratio of the ΔAD signal fluctuates. Because, as the PWM modulation output, it is necessary to output a signal with a pulse width, that is, a duty ratio according to the sound signal, in the case where the ΔAD signal of the Class-AD is used as output of the PWM modulator, quality of the sound signal component degrades due to DC fluctuation of the carrier.

Note that it is possible to suppress harmful effects generated by the non-ideal factor of the carrier generator by giving feedback to the amplifier. However, this countermeasure is not effective as a countermeasure against harmful effects generated by the non-ideal factor of the carrier generator because it is difficult to set a large loop gain at the class D amplifier due to band constraint.

Therefore, in the present embodiment, by generating each PWM modulation output so that change of the duty ratio of the ΔAD signal caused by DC fluctuation at the upward inclined edge side of the triangle wave which is a carrier and change of the duty ratio of the ΔAD signal caused by DC fluctuation at the downward inclined edge side are cancelled out, it is configured such that even in the case where the DC of the carrier fluctuates by the non-ideal factor, the ΔAD signal, a duty ratio of which does not change can be generated.

As illustrated in FIG. 1, the PWM modulator 1 according to the embodiment is configured with a carrier generator 20, a comparison circuit 21 and a selector 22. The carrier generator 20 can generate a triangle wave carrier or a saw tooth wave carrier. For example, the carrier generator 20 can generate a saw tooth wave carrier of a cycle half the cycle of the triangle wave carrier. That is, the saw tooth wave carrier generated by the carrier generator 20 may be a saw tooth wave carrier having an upward inclined edge both in the upward inclined edge period and the downward inclined edge period of the triangle wave carrier.

A modulation signal and a carrier are input to the comparison circuit 21. In the following description, description will be provided assuming that the modulation signal is a sound signal. The comparison circuit 21 compares the level of the carrier with the level of the sound signal and obtains a first comparison result. Further, the comparison circuit 21 inverts or shifts by 180 degrees either the carrier or the sound signal, compares the levels, and obtains a second comparison result. The comparison circuit 21 is configured to be able to output the first comparison result and an inversion signal of the first comparison result (hereinafter, referred to as a first inverted comparison result), and the second comparison result and an inversion signal of the second comparison result (hereinafter, referred to as a second inverted comparison result). Note that, in order to obtain only the PWM modulation output of the Class-AD, the comparison circuit 21 only has to output the first comparison result and the second inverted comparison result.

At the comparison circuit 21, a comparison result between a carrier obtained by inverting or shifting by 180 degrees the carrier (hereinafter, referred to as an inverted carrier) and the sound signal is the same as a comparison result between a signal obtained by inverting or shifting by 180 degrees the sound signal (inverted sound signal) and the carrier, and this comparison result is the second comparison result.

Each comparison result from the comparison circuit 21 is provided to the selector 22. A clock synchronized with the carrier from the carrier generator 20 is supplied to the selector 22 as a control signal. The selector 22 outputs the comparison result while switching the input comparison result for each cycle of the carrier. For example, the selector 22 is configured to be able to output the comparison result while switching between the first comparison result and the second inverted comparison result for each cycle of the carrier. In the present embodiment, the selector 22 can output at least the AD-A signal and the AD-B signal in the Class-AD by generating an inversion signal of the output which is selectively switched. Further, the selector 22 may be configured to be able to also output the BD-A signal and the BD-B signal of the Class-BD.

FIG. 6A to FIG. 6E are waveform diagrams for explaining that the ΔAD signal of the Class-AD can be obtained from the first comparison result and the second inverted comparison result. FIG. 6A illustrates a saw tooth wave carrier (solid line), a triangle wave carrier (dashed line), and a sound signal (solid line) and an inverted sound signal (dashed line). Note that, while FIG. 6A illustrates an example where the frequency of the sound signal is five times the carrier frequency of the saw tooth wave, the present embodiment is not limited to this.

In the related art in FIG. 4, in the case where a triangle wave carrier indicated with the dashed line in FIG. 6A is input, the AD-A signal from the comparator 17 becomes an L level in the case where the sound signal level is smaller than the carrier signal level as indicated with the waveform in FIG. 6B. The H level and the L level of the ΔAD signal change in a similar manner to the H level and the L level of the AD-A signal.

On the other hand, the saw tooth wave carrier indicated with the solid line in FIG. 6A is output from the carrier generator 20. The saw tooth wave carrier, for example, corresponds to a waveform of the upward inclined edge of the triangle wave carrier in an odd cycle, and corresponds to a waveform obtained by inverting the downward inclined edge of the triangle wave carrier in an even cycle. The first comparison result between the sound signal and the saw tooth wave carrier in this odd cycle is illustrated in FIG. 6C. Further, the second inverted comparison result in the even cycle is illustrated in FIG. 6D.

In the even cycle, because the saw tooth wave carrier is the inversion signal of the triangle wave carrier, in FIG. 6A, a thick line portion formed by the sound signal and the triangle wave carrier and a thick line portion formed by the inverted sound signal and the saw tooth wave carrier have axisymmetric relationship. That is, in the even cycle, a timing at which the sound signal intersects with the triangle wave carrier is the same as a timing at which the inverted sound signal intersects with the saw tooth wave carrier.

The selector 22 is controlled by a clock, selects the first comparison result in the odd cycle and selects the second inverted comparison result in the even cycle. By this means, output illustrated in FIG. 6E can be obtained from the selector 22. As is clear from comparison between FIG. 6B and FIG. 6E, a signal similar to the AD-A signal in the case where the triangle wave carrier is employed is obtained from the selector 22.

In the case where the DC of the triangle wave carrier in FIG. 6A fluctuates, a timing at which the sound signal intersects with the triangle wave carrier changes in the odd cycle in a direction reverse to the direction of the timing in the even cycle. On the other hand, in the case where the DC of the saw tooth wave carrier in FIG. 6A fluctuates, a timing at which the inverted sound signal intersects with the saw tooth wave carrier changes in the same direction in the odd cycle and in the even cycle. That is, the ΔAD signal is a signal such that change of the duty ratio due to carrier noise and carrier distortion in the odd cycle and the change of the duty ratio due to carrier noise and carrier distortion in the even cycle are cancelled out, and, in the present embodiment, tolerance against the carrier noise and the carrier distortion is improved. Note that, while an example has been described in FIG. 6A where the second inverted comparison result is obtained from the inverted sound signal and the saw tooth wave carrier, it is obvious that a similar result can be also obtained by obtaining the second inverted comparison result from the sound signal and the inversion signal of the saw tooth wave carrier.

As the PWM modulator 1 in FIG. 1, the PWM modulator 30 in FIG. 2 may be employed. The PWM modulator 30 is configured with a carrier generator 32, an inverting circuit 36, comparators 37 and 38, selectors 41 and 42 and inverting circuits 40 and 43. The carrier generator 32 corresponds to the carrier generator 20 in FIG. 1, the inverting circuit 36 and the comparators 37 and 38 correspond to the comparison circuit 21 in FIG. 1, and the selectors 41 and 42 and the inverting circuits 40 and 43 correspond to the selector 22 in FIG. 1. Note that, while the PWM modulator 30 supports the PWM modulation output of both the Class-A and the Class-B, in the case where the PWM modulator 30 only has to support the PWM modulation output of the Class-A, the selector 42 and the inverting circuit 40 can be omitted.

The carrier generator 32 is configured with a reference voltage supply 33, a waveform shaping circuit 34 and a clock generator 35. The reference voltage supply 33 generates a reference voltage Vref and supplies the reference voltage Vref to the waveform shaping circuit 34. The clock generator 35 generates a clock corresponding to a predetermined carrier frequency and outputs the clock to the waveform shaping circuit 34. The waveform shaping circuit 14 generates a carrier of a cycle corresponding to the clock cycle by shaping a waveform of the reference voltage using the clock. The carrier is, for example, a saw tooth wave having an upward inclined edge or a triangle wave having upward and downward inclined edges.

In the case where output corresponding to output in the case where the triangle wave carrier is used is obtained from the PWM modulator 30 in FIG. 2 in the related art in FIG. 4, the carrier generator 32 generates a saw tooth wave carrier, and, in the case where output corresponding to output in the case where the saw tooth wave carrier is used is obtained from the PWM modulator 30 in FIG. 2 in the related art in FIG. 4, the carrier generator 32 generates a triangle wave carrier. Note that, hereinafter, description will be provided assuming that the carrier generator 32 generate a saw tooth wave carrier. In this case, it is assumed that a frequency of the saw tooth wave carrier is double the frequency of the clock frequency.

The sound signal is supplied to the non-inverted (normal phase) input end of the comparator 37, and also provided to the inverting circuit 36. The inverted sound signal obtained by inverting the sound signal at the inverting circuit 36 is provided to the non-inverted (normal phase) input end of the comparator 38. A carrier from the carrier generator 32 is input to the inverted (reverse phase) input ends of the comparators 37 and 38.

The comparator 37 compares the sound signal level with the carrier level, and outputs a comparison result (first comparison result). Further, the comparator 37 is configured to be able to output a first inverted comparison result obtained by inverting the first comparison result.

The comparator 38 compares the inverted sound signal level with the carrier level and outputs a comparison result (second comparison result). Further, the comparator 38 is configured to be able to output a second inverted comparison result obtained by inverting the second comparison result.

The first comparison result and the second inverted comparison result are supplied to the selector 41, and the first inverted comparison result and the second comparison result are supplied to the selector 42. A control signal S based on the clock from the clock generator 35 is supplied to the selector 41. Further, the control signal S is supplied to the inverting circuit 40, and the inverting circuit 40 supplies an inversion signal of the control signal S (hereinafter, referred to as an inverted control signal /S) to the selector 42.

The control signal S is a signal, an H level and L level of which are switched in the carrier cycle, and the level becomes an H level (logical value "1") in an odd cycle of the saw tooth wave carrier, and the level becomes an L level (logical value "0") in an even cycle of the saw tooth wave carrier. The selector 41 selects and outputs the first comparison result in the case where the control signal S is "1", and selects and outputs the second inverted comparison result in the case where the control signal S is "0". Further, the selector 42 selects and outputs the first inverted comparison result in the case where the inverted control signal /S is "1" (S="0") and selects and outputs the second comparison result in the case where the inverted control signal /S is "0" (S="1").

The output of the selector 41 is output as the AD-A signal or the BD-A signal, and the output of the selector 42 is output as the BD-B signal. Further, the output of the selector 41 is inverted at the inverting circuit 43 and output as the AD-B signal. Note that, also in the present embodiment, a difference between the AD-A signal and the AD-B signal is used as the ΔAD signal which is differential output, and a difference between the BD-A signal and the BD-B signal is used as the ΔBD signal which is differential output.

Operation of the embodiment configured as described above will be described next with reference to FIG. 7A to FIG. 7L and FIG. 8A to FIG. 8H. FIG. 7A to FIG. 7L are waveform diagrams for explaining the operation of the embodiment.

The carrier generator 32 generates the saw tooth wave carrier indicated with the solid line in FIG. 7A synchronized with the clock. This saw tooth wave carrier, for example, corresponds to the waveform of the upward inclined edge of the triangle wave carrier indicated with the dashed line in FIG. 7A in the odd cycle, and corresponds to the waveform obtained by inverting the downward inclined edge of the triangle wave carrier in the even cycle. The saw tooth wave carrier is supplied to the inverted input ends of the comparators 37 and 38.

The sound signal indicated with the solid line in FIG. 7A is provided to the non-inverted input end of the comparator 37. The sound signal is inverted by the inverting circuit 36, and the inverted sound signal indicated with the dashed line in FIG. 7A is provided to the non-inverted input end of the comparator 38.

FIG. 7B to FIG. 7D respectively illustrate the AD-A signal (=the BD-A signal), the AD-B signal and the BD-B signal from the comparators 17 and 18 in the case where the triangle wave carrier in FIG. 7A and the sound signal are input in the related art in FIG. 4.

In the present embodiment, the comparator 37 compares the sound signal with the saw tooth wave carrier and outputs the first comparison result in which the level is an L level in the case where the sound signal level is lower than the saw tooth wave carrier level and the level is an H level in the case where the sound signal level is higher than the saw tooth wave carrier level as illustrated in FIG. 7E. Further, the comparator 37 also outputs the first inverted comparison result illustrated in FIG. 7F obtained by inverting the first comparison result.

The comparator 38 compares the inverted sound signal with the saw tooth wave carrier and outputs the second comparison result in which the level is an L level in the case where the inverted sound signal level is lower than the saw tooth wave carrier level and the level is an H level in the case where the inverted sound signal level is higher than the saw tooth wave carrier level as illustrated in FIG. 7G. Further, the comparator 38 also outputs the second inverted comparison result illustrated in FIG. 7H obtained by inverting the second comparison result. The first comparison result and the second inverted comparison result are supplied to the selector 41, and the first inverted comparison result and the second comparison result are supplied to the selector 42.

The selector 41 is controlled using the control signal S, and the selector 42 is controlled using the inverted control signal /S. The control signal S is, for example, a signal, a level of which becomes an H level in the odd cycle of the saw tooth wave carrier and becomes an L level in the even cycle. The selector 41 selects and outputs the first comparison result (FIG. 7E) during a period while the control signal S is an H level (logical value "1"), that is, in the odd cycle of the saw tooth wave carrier and selects and outputs the second inverted comparison result (FIG. 7H) during a period while the control signal S is an L level (logical value "0"), that is, in the even cycle of the saw tooth wave carrier.

The output of the selector 41 is output as the AD-A signal or the BD-A signal illustrated in FIG. 7J. Further, the output of the selector 41 is inverted at the inverting circuit 43 and output as the AD-B signal illustrated in FIG. 7K. As is clear from comparison between FIG. 7B and FIG. 7J and comparison between FIG. 7C and FIG. 7K, signals similar to the AD-A signal, the BD-A signal and the AD-B signal obtained in the case where the triangle wave carrier is used in the related art can be obtained from the selector 41.

Note that, while an example has been described in FIG. 7A to FIG. 7L where the carrier signal frequency is five times as high as the sound signal frequency, actually, the carrier signal frequency is set at a sufficiently high value compared to the sound signal frequency. That is, it can be considered that the sound signal is a substantially constant value in several carrier cycles, and the L level period of the first comparison result in the odd cycle is substantially the same as the L level period of the second inverted comparison result in the even cycle.

On the other hand, the selector 42 selects and outputs the first inverted comparison result (FIG. 7F) during a period while the inverted control signal /S is an L level (logical value "0"), that is, in the odd cycle of the saw tooth wave carrier, and selects and outputs the second comparison result (FIG. 7G) during a period while the inverted control signal /S is an H level (logical value "1"), that is, in the even cycle of the saw tooth wave carrier.

The output of the selector 42 is output as the BD-B signal illustrated in FIG. 7L. As is clear from comparison between FIG. 7D and FIG. 7L, a signal similar to the BD-B signal obtained in the case where the triangle wave carrier is used in the related art can be obtained from the selector 42.

Note that, concerning both the Class-AD modulation output and the Class-BD modulation output, because switching noise as illustrated in FIG. 7J to FIG. 7L is generated at a reset timing at which the level of the saw tooth wave carrier changes from the H level to the L level, in order to eliminate this switching noise portion, an elimination circuit may be provided.

It is now assumed that carrier noise and carrier distortion occur in the saw tooth wave carrier. In either of the case where low-frequency carrier noise is mixed into the saw tooth wave carrier and the case where non-linear carrier distortion occurs, these influences appear as DC fluctuation of the carrier in a short period of approximately several carrier cycles.

FIG. 8A to FIG. 8H are waveform diagrams for explaining effects of the embodiment. The dashed lines in FIG. 8A to FIG. 8H indicate an example in the case where an ideal saw tooth wave carrier is generated from the carrier generator 32, and the solid lines indicate an example in the case where a non-ideal factor is included in the saw tooth wave carrier from the carrier generator 32. FIG. 8A and FIG. 8E illustrate the saw tooth wave carrier, the sound signal and the inverted sound signal, FIG. 8B and FIG. 8F illustrate the AD-A signal, the BD-A signal or the ΔAD signal, FIG. 8C and FIG. 8G illustrate the BD-B signal, and FIG. 8D and FIG. 8H illustrate the ΔBD signal.

FIG. 8A to FIG. 8H illustrate a state of two cycles of the carrier, FIG. 8A to FIG. 8D illustrate an example in the case where DC fluctuation of the carrier appears at the positive side, and FIG. 8E to FIG. 8H illustrate an example in the case where DC fluctuation of the carrier appears at the negative side. FIG. 8A illustrates that the DC of the saw tooth wave carrier indicated with the dashed line fluctuates at the positive side due to the non-ideal factor and changes to the carrier indicated with the solid line waveform. Further, FIG. 8E illustrates that the DC of the saw tooth wave carrier indicated with the dashed line fluctuates to the negative side due to the non-ideal factor and changes to the carrier indicated with the solid line waveform.

FIG. 8A and FIG. 8E illustrate that the carrier frequency is sufficiently higher than the sound signal frequency, and the level of the sound signal is a substantially constant level in several cycles of the carrier. FIG. 8A and FIG. 8E illustrate an example where the amplitude of the sound signal is the same as the amplitude of the carrier, and the inverted sound signal is a signal obtained by inverting the sound signal assuming that the amplitude center of the carrier (dashed line) is 0 level.

In the odd cycle in FIG. 8A to FIG. 8H, the first comparison result becomes an L level in the case where the sound signal level is smaller than the carrier level and becomes an H level in other periods. Further, in the odd cycle, the second inverted comparison result becomes an L level in the case where the inverted sound signal level is greater than the carrier level and becomes an H level in other periods. By this means, in the case where the saw tooth wave carrier has an ideal waveform, the AD-A signal becomes one indicated with the dashed line in FIG. 8B or FIG. 8F. Note that the BD-A signal and the $\Delta$AD signal also have the same waveform as the waveform of the AD-A signal.

As a result of the DC fluctuation of the saw tooth wave carrier, in FIG. 8A and FIG. 8E, the waveform changes from the waveform indicated with the dashed line to the waveform indicated with the solid line. In this case, the AD-A signal becomes the signal indicated with the solid line in FIG. 8B or FIG. 8F. Note that the BD-A signal and the $\Delta$AD signal also have the same waveform as the waveform of the AD-A signal.

Because the inclination of the upward inclined edge of the saw tooth wave carrier in the odd cycle is the same as that in the even cycle, a direction and a degree of the change of the AD-A signal in the L level period due to the DC fluctuation of the saw tooth wave carrier in the odd cycle are the same as those in the even cycle in a period while the sound signal level is substantially constant.

Therefore, even in the case where a timing at which the L level period of the AD-A signal occurs changes due to the DC fluctuation of the saw tooth wave carrier, as illustrated in FIG. 8B and FIG. 8F, the duty ratio of the AD-A signal does not change. Note that it would be better to set a relatively greater value as an amplitude of the saw tooth wave carrier than an amplitude of the sound signal so that change of the AD-A signal by DC fluctuation of the saw tooth wave carrier does not occur over the cycle of the saw tooth wave carrier. The BD-A signal and the $\Delta$AD signal also have the same waveform as that of the AD-A signal, and, even in the case where DC fluctuation of the saw tooth wave carrier occurs, the duty ratio does not change.

Note that an absolute value of the inclination of the upward inclined edge of the saw tooth wave carrier in the even period matches an absolute value of the inclination of the downward inclined edge of the triangle wave carrier. Therefore, a degree of the change of the AD-A signal in the L level period in the even cycle caused by the DC fluctuation of the saw tooth wave carrier is the same as a degree of the change of the AD-A signal in the L level period in the downward inclined edge period caused by the DC fluctuation of the triangle wave carrier, while the direction is opposite.

In the present embodiment, it is possible to obtain a $\Delta$AD signal having a duty ratio which is the same as the duty ratio of the $\Delta$AD signal generated using the triangle wave in the related art and which does not change even in the case where DC fluctuation occurs in the saw tooth wave carrier.

Further, in the present embodiment, also concerning the $\Delta$BD signal, it is possible to obtain a $\Delta$BD signal, a duty ratio of which does not change due to a non-ideal factor of the saw tooth wave carrier. In the odd cycle in FIG. 8A to FIG. 8H, the first inverted comparison result becomes an L level in the case where the sound signal level is smaller than the carrier level, and becomes an H level in other periods. Further, in the odd cycle, the second comparison result becomes an L level in the case where the inverted sound signal level is greater than the carrier level, and becomes an H level in other periods. By this means, in the case where the saw tooth wave carrier has an ideal waveform, the BD-B signal becomes a signal indicated with the dashed line in FIG. 8C or FIG. 8G.

In FIG. 8A and FIG. 8E, it is assumed that the waveform of the saw tooth wave carrier changes from the waveform indicated with the dashed line to the waveform indicated with the solid line due to DC fluctuation. In this case, the BD-B signal becomes a signal indicated with the solid line in FIG. 8C or FIG. 8G. The $\Delta$BD signal is a difference between the BD-A signal illustrated in FIG. 8B or FIG. 8F and the BD-B signal illustrated in FIG. 8C or FIG. 8G, and becomes a signal illustrated in FIG. 8D or FIG. 8H.

Because the inclination of the upward inclined edge of the saw tooth wave carrier in the odd cycle is the same as that in the even cycle, during a period while the sound signal level is substantially constant, a direction and a degree of the change of the BD-A signal and the BD-B signal in the L level period in the odd cycle caused by the DC fluctuation of the saw tooth wave carrier are the same as those in the even cycle.

Therefore, even in the case where a timing at which the L level period of the $\Delta$BD signal occurs changes by the DC fluctuation of the saw tooth wave carrier, as illustrated in FIG. 8D or FIG. 8H, the duty ratio of the $\Delta$BD signal does not change. In this manner, in the present embodiment, it is possible to obtain a $\Delta$BD signal having a duty ratio which is the same as the duty ratio of the $\Delta$BD signal generated using the triangle wave in the related art and which does not change even in the case where DC fluctuation occurs in the saw tooth wave carrier.

Note that the selector 42 outputs the BD-B signal, and does not contribute to generation of the AD-A signal or the AD-B signal. Therefore, in the case where only the Class-AD is employed, the selector 42 and the inverting circuit 40 can be omitted. Further, as described above, in the comparison at the comparator 38, the comparison result between the inverted sound signal and the carrier and the comparison result between the sound signal and the inverted carrier have relationship in which polarity of output is inverted. Therefore, it is also possible to input the sound signal and the inverted carrier instead of inputting the inverted sound signal and the carrier to the comparator 38, and insert an inverting circuit to input of the selector 41 and the selector 42.

(Modification)

Figure 9:
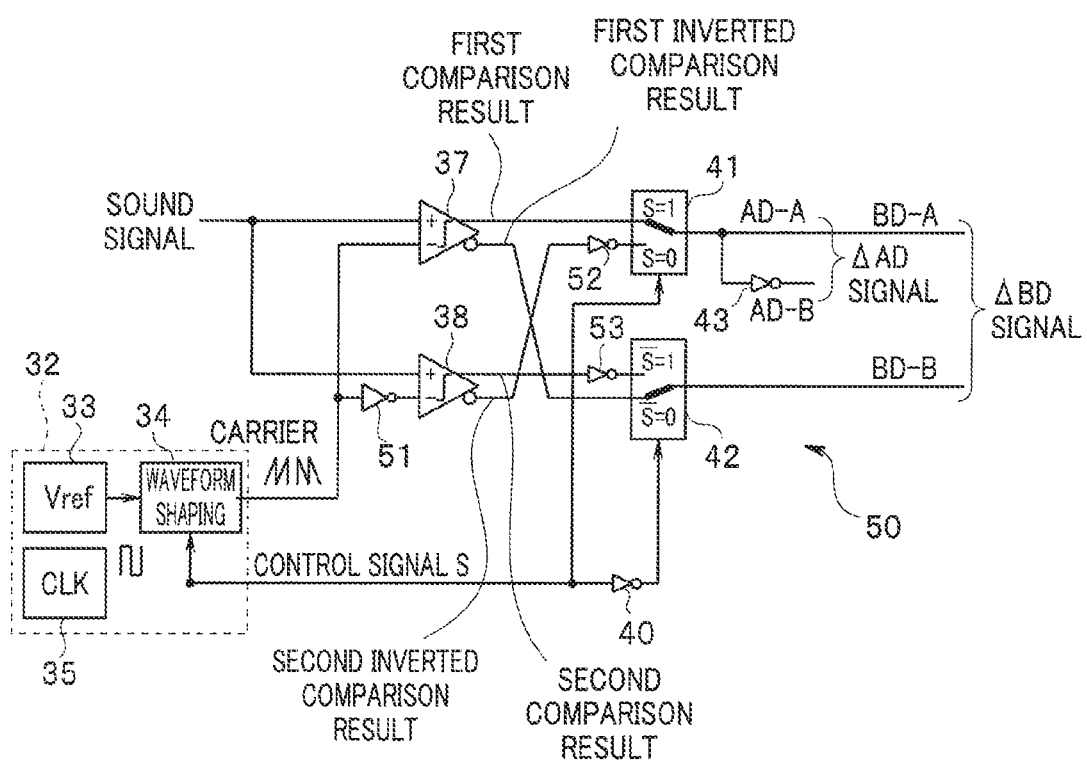
FIG. 9 is a circuit diagram illustrating a modification.

FIG. 9 is a circuit diagram illustrating a modification of the PWM modulator 50. In FIG. 9, the same reference numerals are assigned to the components which are the same as those in FIG. 2, and explanation will be omitted. The PWM modulator 50 differs from the PWM modulator 30 in FIG. 2 in that the inverting circuit 36 is omitted, inverting circuits 51 to 53 are employed, and inverting circuits are employed at input of the selector 41 and the selector 42.

The carrier from the carrier generator 32 is supplied to the inverting circuit 51 and inverted. The input sound signal is input as is to a non-inverted input end of the comparator 38, and the inverted carrier from the inverting circuit 51 is input. The comparator 38 compares the sound signal with the inverted carrier, and outputs the second comparison result in which the level becomes an L level in the case where the sound signal level is lower than the inverted carrier level and the level becomes an H level in the case where the sound signal level is higher than the inverted carrier level. The second comparison result from the comparator 38 is inverted by the inverting circuit 53 and supplied to the selector 42, and the second inverted comparison result is inverted by the inverting circuit 52 and supplied to the selector 42. The comparator 38 compares the sound signal with the downward inclined edge level of the triangle wave in the even cycle in FIG. 7A to FIG. 7L in the case where an ideal carrier is generated, and can output the second comparison result in which the polarity in FIG. 7G is inverted and the second inverted comparison result in which the polarity in FIG. 7H is inverted.

Further, in the case where DC fluctuation occurs in the saw tooth wave carrier, a degree of the DC fluctuation of the saw tooth wave carrier is the same as that of the inverted carrier, while the direction is reverse. An absolute value of the inclination of the upward inclined edge of the saw tooth wave carrier is the same as an absolute value of the inclination of the downward inclined edge of the inverted carrier. Therefore, a direction and a degree of change in the L period of the comparator 37 in the odd cycle caused by DC fluctuation of the saw tooth wave carrier become the same as those of change in the L period of the comparator 38 in the even cycle.

Therefore, also in the PWM modulator 50, it is possible to obtain output of the Class-AD and the Class-BD similar to that of the PWM modulator 30.

Note that inverting the saw tooth wave carrier is equivalent to shifting the phase of the saw tooth wave carrier by 180 degrees. Therefore, a 180-degree shift circuit may be employed in place of the inverting circuit 51. Further, also concerning the sound signal, in the case where the frequency is fixed, or the like, a 180-degree shift circuit may be employed in place of the inverting circuit 36 in FIG. 2.

Further, in comparison at the comparators 37 and 38, the comparison result between the sound signal and the carrier is the same as the comparison result between the inverted sound signal and the inverted carrier. Therefore, it is also possible to input the inverted sound signal and the inverted carrier instead of inputting the sound signal and the carrier to the comparator 37, and, as the present embodiment, it is also possible to employ a configuration other than that illustrated in FIG. 2 or FIG. 9. For example, it is also possible to employ a configuration where an inverted carrier having a downward inclined edge, obtained by inverting the saw tooth wave carrier is generated from the carrier generator 32. Still further, it is obvious that there are a plurality of possible modifications where positions of the inverting circuits are changed by setting selection of the selectors 41 and 42 as appropriate.

Figure 10A:
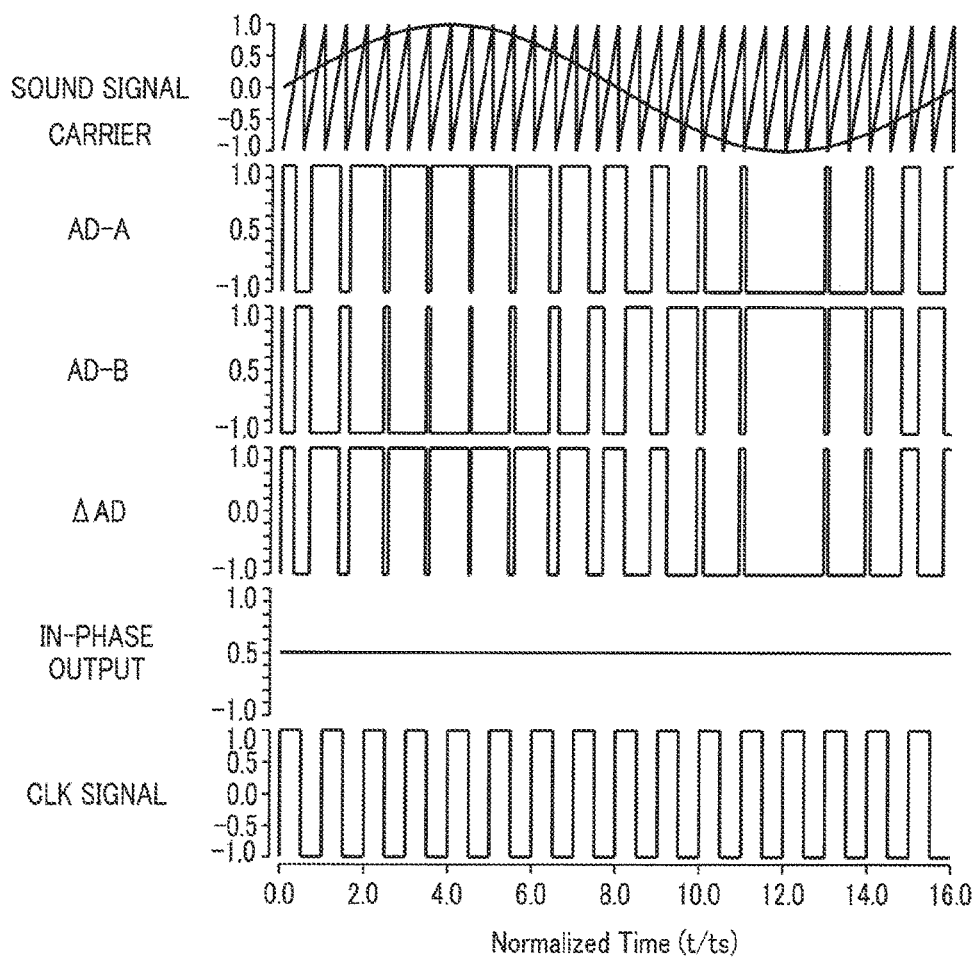
FIG. 10A and FIG. 10B are graphs illustrating time domain response in the case where an ideal saw tooth wave carrier is generated in the present embodiment.
Figure 10B:
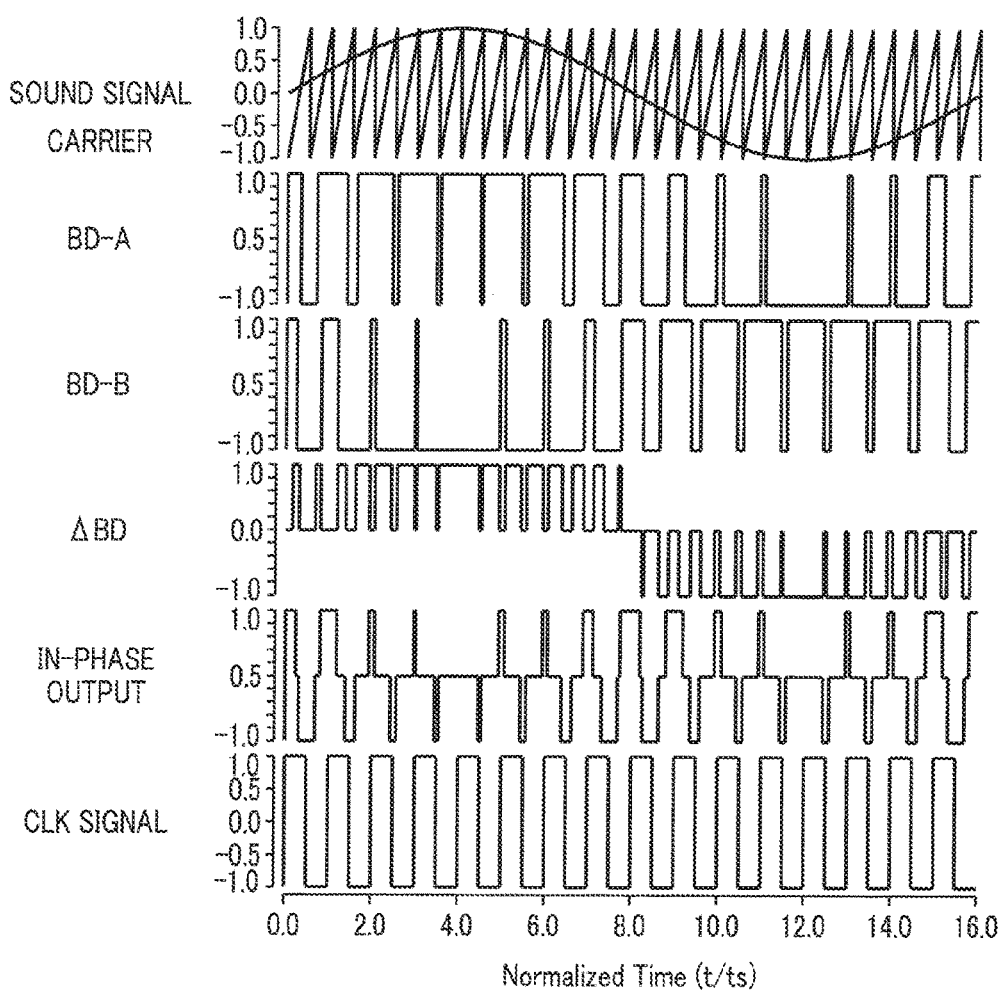

FIG. 10A to FIG. 13B are graphs illustrating characteristics in the embodiment. FIG. 10A and FIG. 10B indicate time normalized with a clock cycle is on a horizontal axis and a signal level on a vertical axis, and illustrate time domain response in the case where an ideal saw tooth wave carrier is generated in the present embodiment. FIG. 10A illustrates the sound signal and the carrier, the AD-A signal, the AD-B signal, the $\Delta$AD signal, the in-phase output and the clock (CLK signal) from the top. Further, FIG. 10B illustrates the sound signal and the carrier, the BD-A signal, the BD-B signal, the $\Delta$BD signal, the in-phase output and the clock (CLK signal) from the top. Note that FIG. 10A and FIG. 10B illustrate an example where a modulation rate is 1, the sound frequency is $1/16$ of the clock frequency, and the saw tooth wave carrier frequency is double the clock frequency.

In the PWM modulator 30 in the present embodiment, the $\Delta$AD signal and the $\Delta$BD signal having a pulse width corresponding to the sound signal are obtained.

Figure 11B:
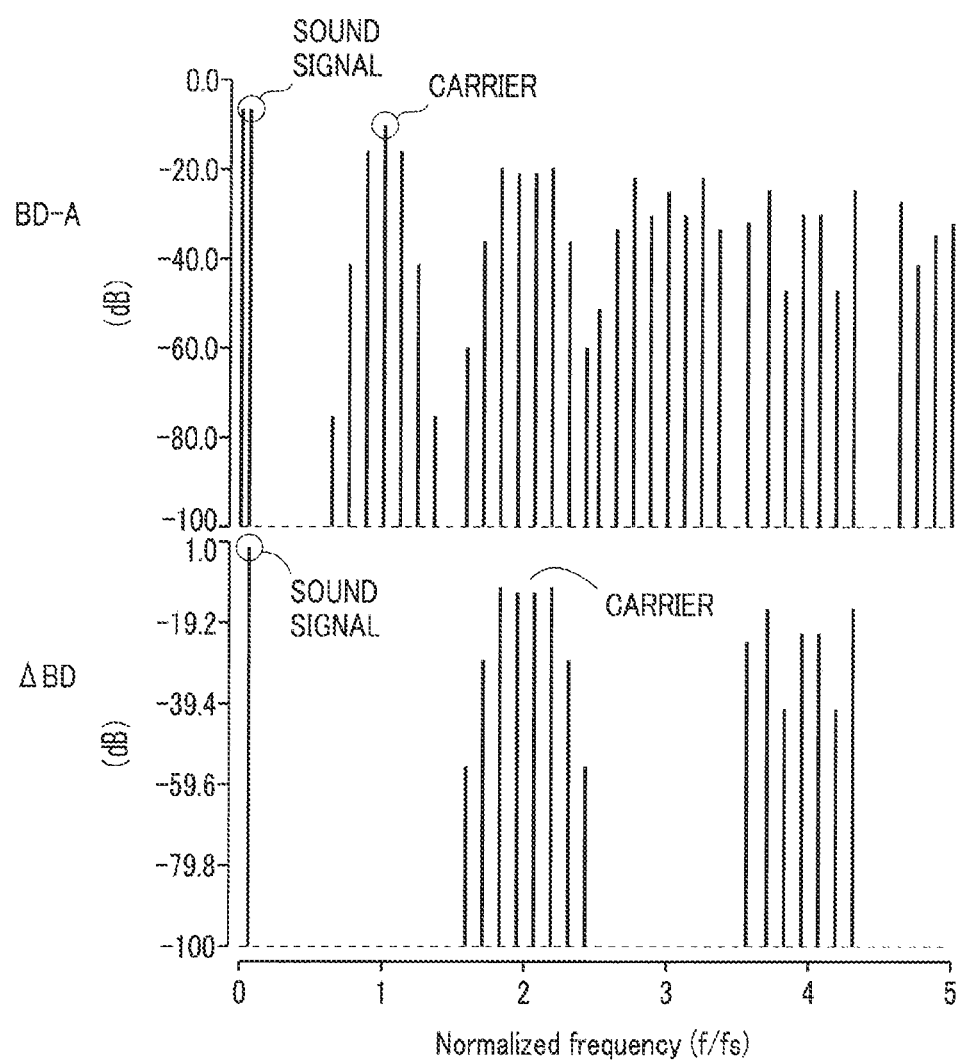

FIG. 11A and FIG. 11B indicate a frequency normalized with a clock frequency fs on a horizontal axis and a signal level on a vertical axis, and illustrate frequency response in the case where an ideal saw tooth wave carrier is generated in the present embodiment. FIG. 11A and FIG. 11B respectively correspond to FIG. 10A and FIG. 10B. An upper part of FIG. 11A illustrates characteristics of the AD-A signal, and a lower part of FIG. 11A illustrates characteristics of the $\Delta$AD signal. Further, an upper part of FIG. 11B illustrates characteristics of the BD-A signal, and a lower part of FIG. 11B illustrates characteristics of the $\Delta$BD signal.

As illustrated in FIG. 11A, the $\Delta$AD signal includes a sound signal component and a carrier component at a portion similar to the portion in the AD-A signal. On the other hand, as illustrated in FIG. 11B, while the BD-A signal is the same signal as the AD-A signal, in the $\Delta$BD signal, a carrier frequency position is located apart double from the frequency position of the sound signal, which indicates that the effective sampling frequency is doubled.

Note that frequency response characteristics in FIG. 11A and FIG. 11B are similar to frequency response characteristics in the case where an ideal triangle wave carrier is used in the related art, and it is possible to generate PWM modulation output having the same characteristics as the characteristics in the case where the triangle wave carrier is used using the saw tooth wave carrier in the present embodiment.

(Effect on carrier noise)

Figure 12:
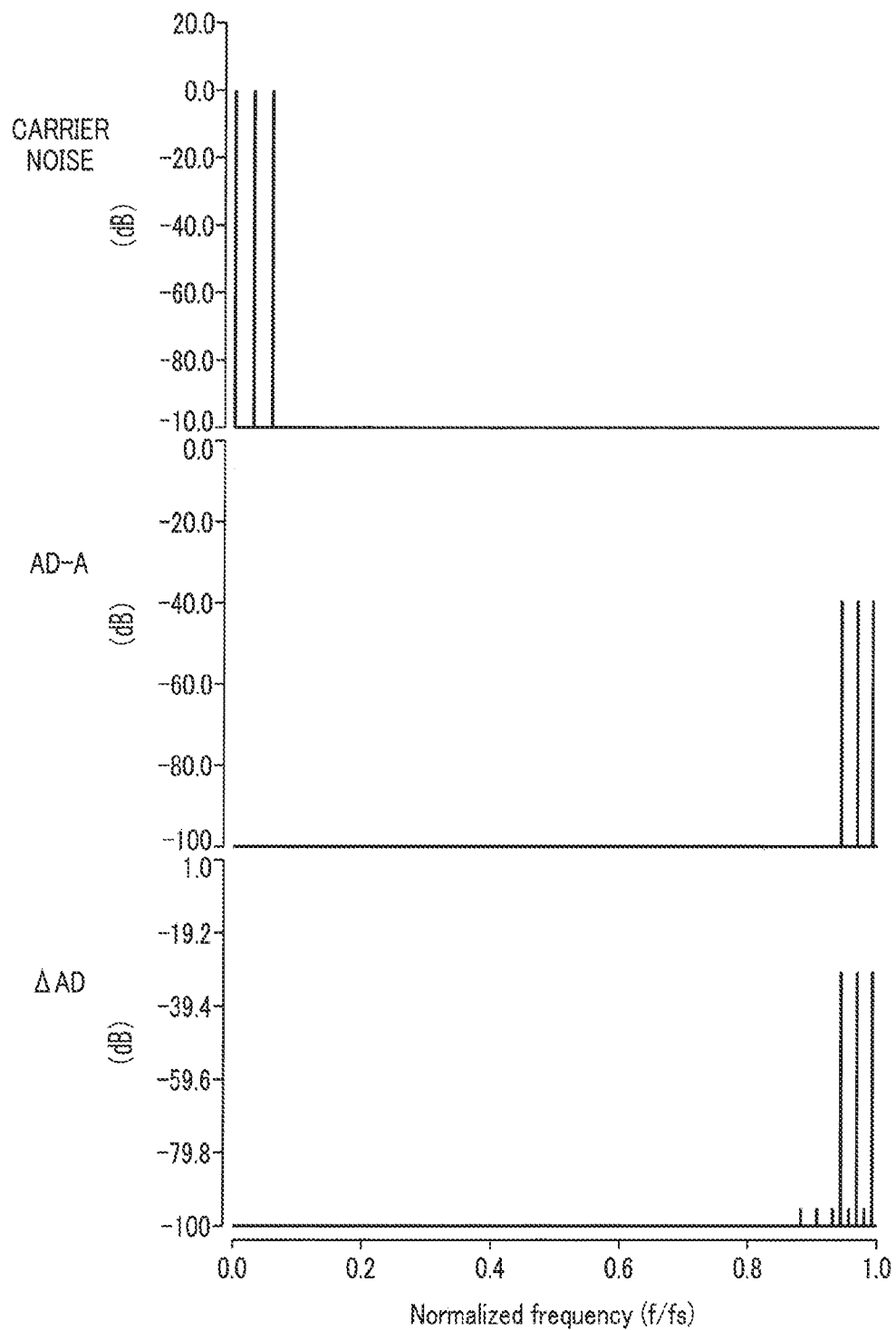
FIG. 12 is a graph illustrating each signal spectrum in the case where carrier noise is added to the saw tooth wave carrier in the present embodiment.

FIG. 12 indicates a frequency normalized with the clock frequency fs on a horizontal axis and a signal level on a vertical axis, and illustrates each signal spectrum in the case where carrier noise is added to the saw tooth wave carrier in the present embodiment. FIG. 12 illustrates an example in the case where input is no signal, and an upper part of FIG. 12 illustrates characteristics of carrier noise, a middle part illustrates characteristics of the AD-A signal, and a lower part illustrates characteristics of the $\Delta$AD signal. The upper part of FIG. 12 indicates that low-frequency noise is superimposed on the carrier. Note that FIG. 12 illustrates an example in the case where low-frequency noise of $1/16$, $1/160$ and $1/320$ of the clock frequency is added to the carrier.

As illustrated in FIG. 12, in the present embodiment, a band of the noise added to the carrier is converted into a frequency band around a frequency (=clock frequency) of $1/2$ of the carrier frequency for the AD-A signal and the $\Delta$AD signal. The low-frequency carrier noise does not appear at the sound signal band, but appears at the band of a frequency of $1/2$ of the carrier frequency which is a relatively high frequency band. Such carrier noise can be easily removed by a filter.

(Effect on carrier distortion)

Figure 13A:
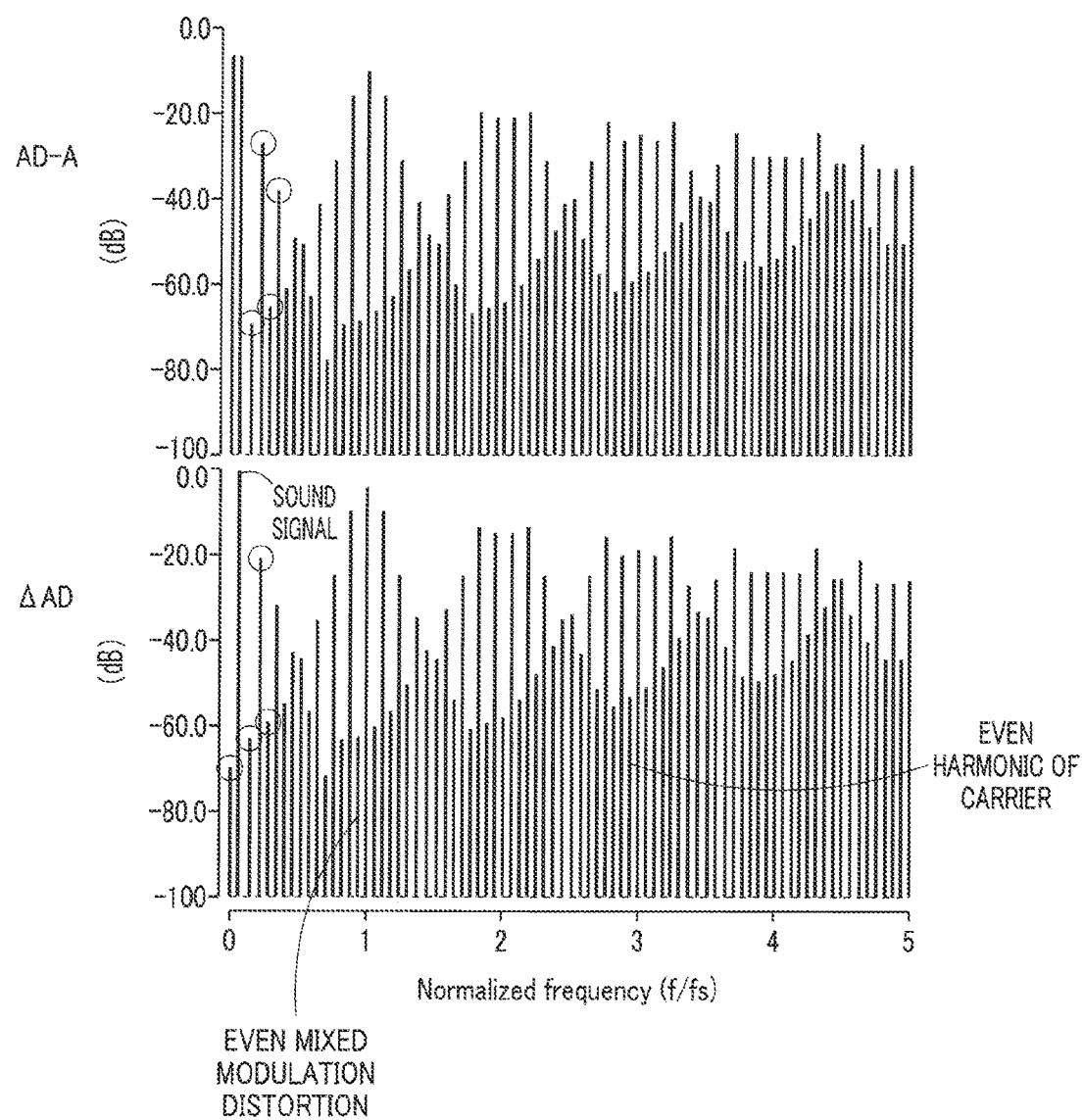
FIG. 13A and FIG. 13B are graphs illustrating each signal spectrum in the case where carrier distortion occurs in the saw tooth wave carrier in the present embodiment.
Figure 13B:
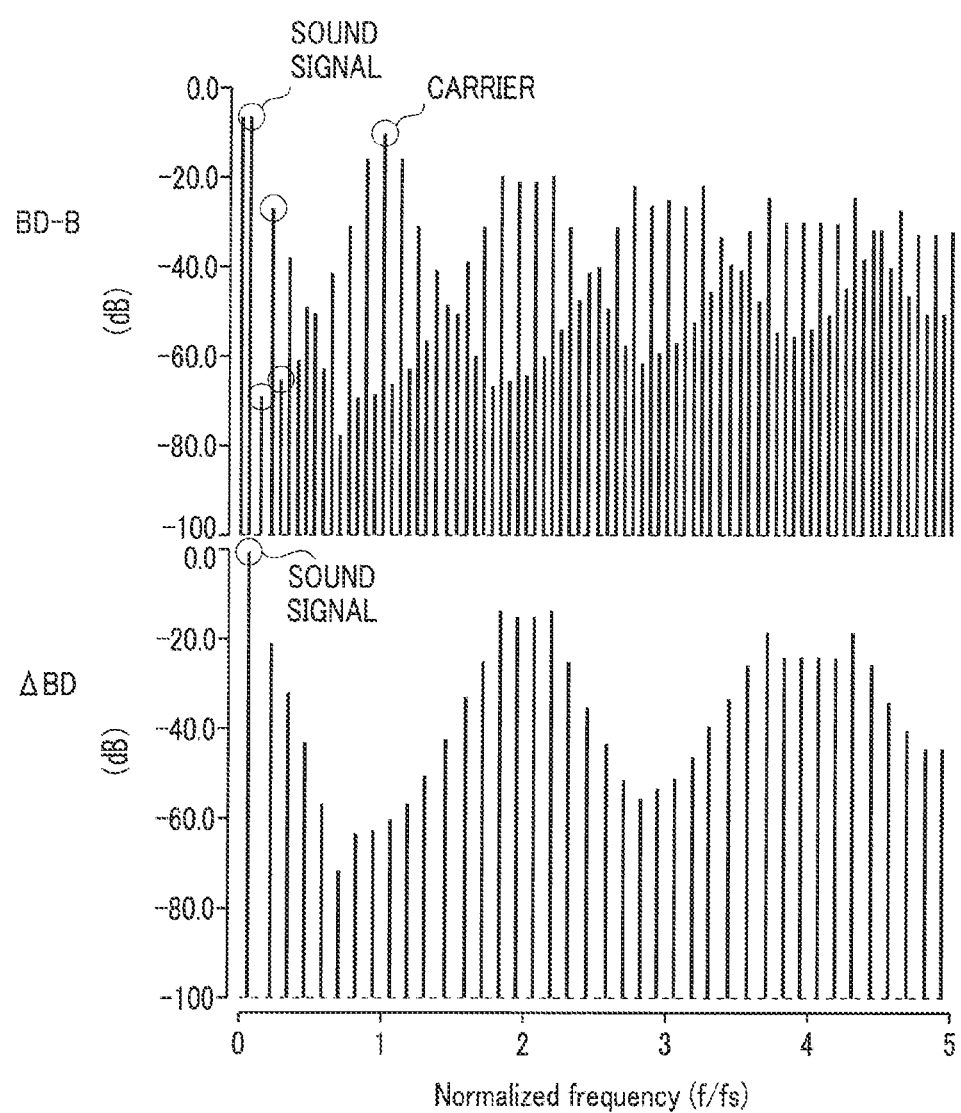

FIG. 13A and FIG. 13B indicate a frequency normalized with the clock frequency fs on a horizontal axis and a signal level on a vertical axis, and illustrate each signal spectrum in the case where carrier distortion occurs in the saw tooth wave carrier in the present embodiment. An upper part of FIG. 13A illustrates characteristics of the AD-A signal, and a lower part illustrates characteristics of the ΔAD signal. Further, an upper part of FIG. 13B illustrates characteristics of the BD-B signal, and a lower part illustrates characteristics of ΔBD signal.

As illustrated in FIG. 13A and FIG. 13B, both in the AD-A signal and the BD-B signal, even distortion of the sound signal indicated with mark O is reduced by a noise cancelling effect, and even mixed modulation distortion of the sound signal is limited. Further, both in the AD-A signal and the BD-B signal, an even harmonic of the carrier is considerably improved. Still further, in a differential output ΔAD signal, not only distortion, harmonic distortion and mixed modulation distortion are improved, but also offset which is generated in accordance with DC fluctuation of the carrier in the related art is improved. Further, concerning the ΔBD signal, doubling the sampling frequency is advantageous as in the case where an ideal carrier is used, and it is possible to simplify the filter.

In this manner, in the present embodiment, it is possible to obtain Class-AD modulation output and Class-BD modulation output which are the same signals as those of the Class-AD modulation output and the Class-BD modulation output obtained in the case where the modulation signal is PWM modulated using the triangle wave carrier, and a duty ratio of which does not change even in the case where DC fluctuation occurs in the carrier. In the present embodiment, with an extremely simple configuration in which a saw tooth wave is used as a carrier, output of the comparators is switched and output for each one cycle of the saw tooth wave carrier, it is possible to suppress influence of noise and non-linearity of the carrier generator. By this means, by employing the PWM modulator in the present embodiment, it is possible to configure a class D amplifier which excels in sound quality at low cost.

Note that, while, in the above-described embodiment, an example has been described where the Class-AD modulation output and the Class-BD modulation output obtained in the case where PWM modulation is performed using the triangle wave carrier, are generated using the saw tooth wave carrier, in the case where the triangle wave carrier is generated from the carrier generator, it is possible to obtain the Class-AD modulation output and the Class-BD modulation output obtained in the case where PWM modulation is performed using the saw tooth wave carrier. That is, in this case, it is possible to obtain the Class-AD modulation output and the Class-BD modulation output which are the same signals as the Class-AD modulation output and the Class-BD modulation output obtained in the case where the modulation signal is PWM modulated using the saw tooth wave carrier, and a duty ratio of which does not change even in the case where DC fluctuation occurs in the triangle wave carrier.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A PWM modulator comprising:
a first comparator configured to compare a first input signal with a first carrier and output a comparison result;
a second comparator configured to compare a second input signal with a second carrier and output a comparison result; and
a selector configured to output the comparison result while switching between the comparison result of the first comparator and the comparison result of the second comparator in a cycle according to a cycle of the first or the second carrier.

2. The PWM modulator according to claim 1, wherein the first and the second carriers are signals which linearly change according to time.

3. The PWM modulator according to claim 1, wherein the second input signal is an inversion signal of the first input signal, and
the first and the second carrier are a same carrier.

4. The PWM modulator according to claim 1, wherein the first and the second input signals are a same signal, and
the second carrier is an inversion signal of the first carrier.

5. A PWM modulator comprising:
a first comparator configured to compare a modulation signal with a carrier which linearly changes according to time and output a first comparison result;
a second comparator configured to output a second inverted comparison result obtained by inverting a second comparison result obtained through comparison between an inversion signal of the modulation signal and the carrier or comparison between the modulation signal and an inversion signal of the carrier; and
a selector configured to output the comparison result while switching between output of the first comparator and output of the second comparator in a cycle according to a cycle of the carrier.

6. The PWM modulator according to claim 5, wherein the carrier is a saw tooth wave carrier or a triangle wave carrier.

7. The PWN modulator according to claim 6, wherein the selector outputs the comparison result while selectively switching between the first comparison result and the second inverted comparison result in a cycle of the saw tooth wave carrier.

8. A PWM modulator comprising:
a first comparator configured to compare a first input signal with a first carrier and output a comparison result and an inverted comparison result of the comparison result;
a second comparator configured to compare a second input signal with a second carrier and output a comparison result and an inverted comparison result of the comparison result;
a first selector configured to output the comparison result while switching between the comparison result from the first comparator and the inverted comparison result from the second comparator in a cycle according to a cycle of the first or the second carrier; and
a second selector configured to output the comparison result while switching between the inverted comparison result from the first comparator and the comparison result from the second comparator in a cycle according to the cycle of the first or the second carrier.

9. The PWM modulator according to claim 8, wherein the second input signal is an inversion signal of the first input signal, and the first and the second carrier are a same carrier.

10. The PWM modulator according to claim 8, wherein the first and the second input signals are a same signal, and the second carrier is an inversion signal of the first carrier.

* * * * *